United States Patent
Zhu et al.

(10) Patent No.: US 9,496,178 B2
(45) Date of Patent: Nov. 15, 2016

(54) SEMICONDUCTOR DEVICE HAVING FINS OF DIFFERENT HEIGHTS AND METHOD FOR MANUFACTURING THE SAME

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/634,266

(22) PCT Filed: Nov. 18, 2011

(86) PCT No.: PCT/CN2011/082413
§ 371 (c)(1),
(2), (4) Date: Sep. 12, 2012

(87) PCT Pub. No.: WO2013/029311
PCT Pub. Date: Mar. 7, 2013

(65) Prior Publication Data
US 2013/0049138 A1 Feb. 28, 2013

(30) Foreign Application Priority Data
Aug. 31, 2011 (CN) .......................... 2011 1 0253935

(51) Int. Cl.
*H01L 29/76* (2006.01)
*H01L 21/8234* (2006.01)

(52) U.S. Cl.
CPC ............. *H01L 21/823431* (2013.01)

(58) Field of Classification Search
CPC .............................. H01L 21/823431
USPC .......................................... 257/288
See application file for complete search history.

(56) References Cited

U.S. PATENT DOCUMENTS

| 2005/0255643 A1 | 11/2005 | Ahn et al. |
| 2008/0006852 A1* | 1/2008 | Beintner et al. ............. 257/255 |
| 2008/0128797 A1 | 6/2008 | Dyer et al. |
| 2008/0265338 A1 | 10/2008 | Yu et al. |
| 2009/0250769 A1* | 10/2009 | Yu et al. ....................... 257/397 |

FOREIGN PATENT DOCUMENTS

| CN | 101261991 B | 9/2008 |
| JP | 2011009296 A * | 1/2011 |

OTHER PUBLICATIONS

Machine translation of Okawa, JP 2011009296, Jan. 13, 2011.*
(Continued)

*Primary Examiner* — Hsin-Yi Hsieh
(74) *Attorney, Agent, or Firm* — Osha · Liang LLP (57) ABSTRACT

The present disclosure provides a semiconductor device and a method for manufacturing the same. The semiconductor device comprises: a semiconductor layer; a first fin being formed by patterning the semiconductor layer; and a second fin being formed by patterning the semiconductor layer, wherein: top sides of the first and second fins have the same height; bottom sides of the first and second fins adjoin the semiconductor layer; and the second fin is higher than the first fin. According to the present disclosure, a plurality of semiconductor devices with different dimensions can be integrated on the same wafer. As a result, manufacturing process can be shortened and manufacturing cost can be reduced. Furthermore, devices with different driving capabilities can be provided.

4 Claims, 5 Drawing Sheets

(56) References Cited

OTHER PUBLICATIONS

International Search Report from PCT/CN2011/082413 mailed Jun. 7, 2012 (3 pages).

Written Opinion from PCT/CN2011/082413 mailed Jun. 7, 2012 (4 pages).

First Office Action issued Sep. 2, 2014, in corresponding Chinese Patent Application No. 201110253935.7, with English translation (12 pages).

* cited by examiner

SEMICONDUCTOR DEVICE HAVING FINS OF DIFFERENT HEIGHTS AND METHOD FOR MANUFACTURING THE SAME

This application is a National Phase application of, and claims priority to, PCT Application No. PCT/CN2011/082413, filed on Nov. 18, 2011, entitled "SEMICONDUCTOR DEVICE AND METHOD FOR MANUFACTURING THE SAME", which claimed priority to Chinese Application No. 201110253935.7, filed on Aug. 31, 2011. Both the PCT Application and Chinese Application are incorporated herein by reference in their entireties.

TECHNICAL FIELD

The present disclosure relates to the field of semiconductor, and in particular, to a semiconductor device with different device dimensions and a method for manufacturing the same.

BACKGROUND

Figure 1:
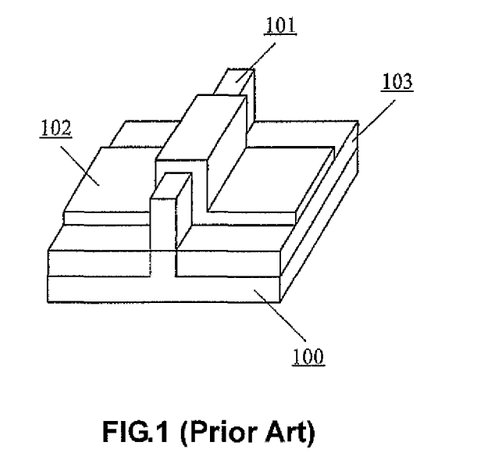
FIG. 1 shows a perspective view of an existing FinFET device.

Fin-type Field Effect Transistors (FinFETs) have attracted much attention due to their excellent performance in suppressing the short channel effect. FIG. 1 shows a perspective view of an existing FinFET device. As shown in FIG. 1, the FinFET comprises: a bulk-Si semiconductor substrate 100; a fin 101 formed on the bulk-Si semiconductor substrate 100; a gate stack 102 across the fin 101, the gate stack 102 comprising, e.g., a gate dielectric layer and a gate electrode layer (not shown); and an isolation layer (e.g. $SiO_2$) 103. In the FinFET, conductive channels are created in three sides (a left side, a right side, and a top side in the figure) of the fin 101, under control of gate electrodes. In other words, portions of the fin 101 under the gate electrodes function as channel regions. A source region and a drain region are located at both sides of each of the channel regions, respectively.

In the example shown in FIG. 1, the FinFET is formed on the bulk-Si semiconductor layer. However, the FinFET can also be formed on other types of substrate, such as a Silicon-on-Insulator (SOI) substrate. Furthermore, the FinFET shown in FIG. 1 is also called a three-gate FET, because the channels are formed in three sides of the fin 101. Alternatively, a two-gate FET may be formed by arranging an isolation layer (e.g. a nitride layer, etc.) between the top side of the fin 101 and the gate stack 102. In such a case, the top side of the fin 101 is not controlled by the gate electrode, and therefore no channel will be created therein.

Although the FinFET provides improved performances in comparison with conventional Metal Oxide Semiconductor Field Effect Transistors (MOSFETs), it also brings some design challenges. In particular, there are generally no limitations on the device widths for the conventional MOSFETs, but the fins of the FinFETs typically need to be of the same height. The fins in different FinFETs need to have the same physical width in order to facilitate photolithographic patterning of the fins.

In other words, the conventional MOSFET provides two parameters, a channel width W and a channel length L, for controlling a conductive current and a cutoff current of the transistor. However, the FinFET only provides one parameter, a length L of the FinFET, for controlling the conductive current and the cutoff current of the transistor. This is because the fin has a fixed height and therefore the channel width is fixed. As a result, for a given length L of the transistor, which defines a ratio between the conductive current and the cutoff current, the conductive current amount from a single fin is fixed.

However, high-performance integrated circuits usually need transistors with varied conductive currents. One way to vary the conductive currents is to change driving capabilities of respective devices by varying fin heights. Layout area will not increase because only vertical dimensions are changed.

However, there has not been any effective way to change the fin heights. Therefore, a new semiconductor manufacturing process is needed for integrating a plurality of semiconductor devices with different device dimensions or fin heights on the same wafer.

SUMMARY

The present disclosure provides, among other things, a new semiconductor device structure and a method for manufacturing the same. According to the present disclosure, fins with different heights can be formed on a semiconductor layer, respectively, whereby a device with different device dimensions can be formed.

According to an aspect of the present disclosure, there is provided a semiconductor device, comprising: a semiconductor layer; a first fin being formed by patterning the semiconductor layer and comprising a first top side and a first bottom side; and a second fin being formed by patterning the semiconductor layer and comprising a second top side and a second bottom side, wherein: the first top side and the second top side have the same height; the first bottom side and the second bottom side adjoin the semiconductor layer; and the second fin is higher than the first fin.

Optionally, the semiconductor device may further comprise gate stacks, each of which being formed across a respective one of the fins.

Optionally, each of the gate stacks may be isolated from the semiconductor layer by an isolation layer.

Optionally, for each of the fins, a hard mask layer may be formed between the top side and the gate stack.

According to another aspect of the present disclosure, there is provided a method for manufacturing a semiconductor device, comprising: providing a semiconductor layer; and patterning a first region and a second region of the semiconductor layer to form a first fin and a second fin, respectively, wherein: the first fin comprises a first top side and a first bottom side; the second fin comprises a second top side and a second bottom side; the first top side and the second top side have the same height; the first bottom side and the second bottom side adjoin the semiconductor layer; and the second fin is higher than the first fin.

The patterning may comprise: patterning the first region and the second region of the semiconductor layer to form the first fin and a part of the second fin, respectively; and further patterning the second region of the semiconductor layer to form a remaining part of the second fin.

Optionally, the method may further comprise forming gate stacks, each of which being formed across a respective one of the fins.

Forming the gate stacks may comprise: forming an isolation layer at both sides of each of the first fin and the second fin on the semiconductor layer; forming a gate dielectric layer and a gate electrode layer in sequence across each of the first fin and the second fin on the isolation layer; and patterning the gate electrode layers to form the gate stacks.

Forming the gate stacks may further comprise patterning the gate dielectric layers.

The method may further comprise: forming a work-function adjusting layer between the gate dielectric layer and the gate electrode layer of each of the gate stacks; and patterning the work-function adjusting layers in forming the gate stacks.

A hard mask layer may be used as a patterning mask in the patterning.

As described above, the semiconductor device and the method for manufacturing the same according to the present disclosure can form the fins with different heights by etching the same semiconductor layer to different depths. This provides devices with different channel widths and therefore different driving capabilities.

BRIEF DESCRIPTION OF THE DRAWINGS

The above and other objects, features, and advantages of the present disclosure will become more apparent from the following description of embodiments of the present disclosure with reference to the drawings, wherein.

DETAILED DESCRIPTION OF EMBODIMENTS

Next, the present disclosure will be described by specific embodiments shown in the drawings. However, it should be understood that these descriptions are only exemplary rather than intending to limit the scope of the present disclosure. Further, in the following description, explanations on well-known structures and technologies are omitted, in order not to unnecessarily obscure the concept of the present disclosure.

Various structural views and cross-sectional views of a semiconductor device according to the present disclosure are shown in the drawings. These drawings are not drawn to scale. Some details may be enlarged and some may be omitted for purpose of clarity. The shapes of respective regions and layers, as well as relative sizes and position relationships thereof are only exemplary, and may be varied due to manufacture tolerances or technique limitations in practice. One of ordinary skill in the art may otherwise design regions/layers having different shapes, sizes, or relative positions according to actual requirements.

The semiconductor device according to the present disclosure comprises a semiconductor layer (e.g., a bulk-Si layer). A plurality of fins with different heights are formed in the semiconductor layer and adjoining the semiconductor layer.

According to the present disclosure, the fins with the different heights are formed by selectively patterning the semiconductor layer. Alternatively, two or more fins may have the same height according to actual requirements.

According to the present disclosure, the fins can be formed with the different heights, therefore channels with different widths and thus devices with different driving capabilities can be provided.

Figure 2:
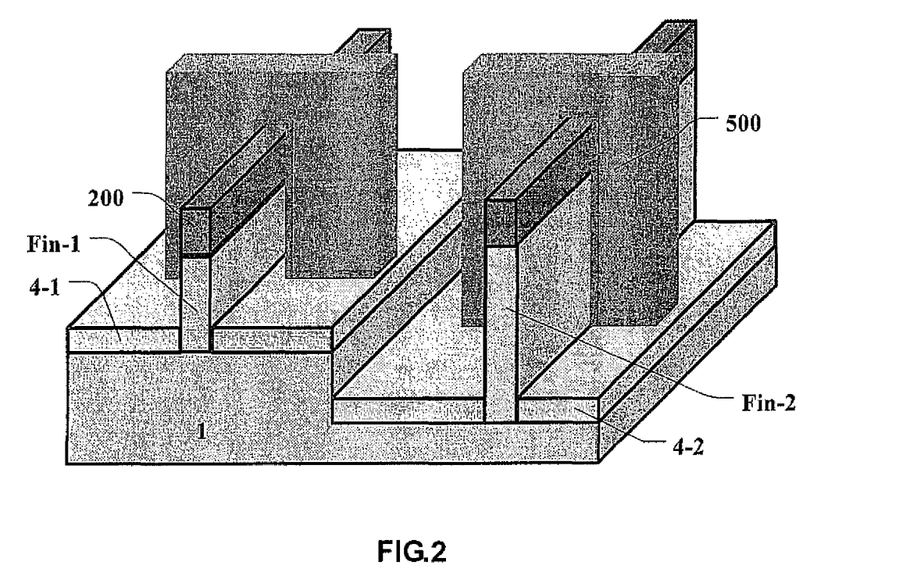
FIG. 2 shows a schematic perspective view of a semiconductor device according to an embodiment of the present disclosure.

FIG. 2 shows a schematic perspective view of an exemplary semiconductor device according to an embodiment of the present disclosure. As shown in FIG. 2, the semiconductor device comprises a semiconductor layer 1 and a first fin Fin-1 and a second fin Fin-2, which are formed by patterning the semiconductor layer 1. The first fin Fin-1 has a height different from that of the second fin Fin-2. In this embodiment, the second fin Fin-2 is higher than the first fin Fin-1. As shown in FIG. 2, a hard mask layer 200 is disposed on a top of each of the first fin Fin-1 and the second fin Fin-2. One of ordinary skill in the art will understand that the hard mask layer 200 may not be necessary.

The first fin Fin-1 has a first top side and a first bottom side. The second fin Fin-2 has a second top side and a second bottom side. Because the first fin Fin-1 and the second fin Fin-2 are formed by the same semiconductor layer 1, their respective top sides (i.e., the first top side and the second top side) have the same height, which corresponds to a top side of the semiconductor layer 1 before it is patterned. According to the present disclosure, the respective bottom sides of the first fin Fin-1 and the second fin Fin-2 (i.e., the first bottom side and the second bottom side) adjoin the semiconductor layer 1.

Here, the term "adjoin" means that the fin is in direct contact with the semiconductor layer and there are no other material layers therebetween. In case that there are other layers such as a substrate under the semiconductor layer, the fin may penetrate the whole semiconductor layer (i.e. the fin is formed with the entire thickness of the semiconductor layer). In such a case, the bottom side of the fin coincides with the bottom side of the semiconductor layer. In the present disclosure, such a case is also considered as the fin "adjoining" the semiconductor layer, because there are no other material layers between the fin and the semiconductor layer.

According to the present disclosure, because the bottom side of the fin adjoins the semiconductor layer, the device finally being formed can have a good performance of heat dissipation.

Here, the height of the fin refers to the height from the top side of the fin to the bottom side thereof. In particular, the height of the first fin Fin-1 refers to the height from the first top side to the first bottom side. The height of the second fin Fin-2 refers to the height from the second top side to the second bottom side. According to the present disclosure, the fins with different heights are formed in the same semiconductor layer by selectively patterning different regions of the semiconductor layer to respective different etching depths. The height of the fin determines the channel width of the device.

The fins Fin-1 and Fin-2 with the different heights can be used to form different devices, including but not limited to, p-type FETs and n-type FETs. In this way, respective threshold voltages of different devices can be controlled efficiently, and thereby device performance can be improved.

Figure 10:
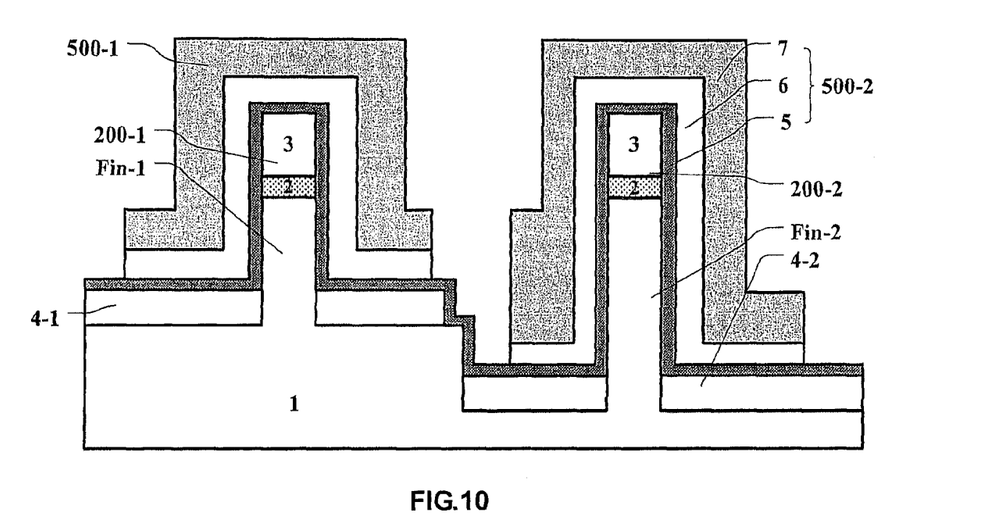

The semiconductor device may further comprise respective gate stacks 500 across the fins. Each of the gate stacks 500 may comprise a gate dielectric layer 5, a work-function adjusting layer 6, and a gate electrode layer 7, as shown in FIG. 10. Each of the gate stacks 500 is isolated from the semiconductor layer 1 by an isolation layer 4-1/2. As shown in FIG. 2, the respective gate stacks of the devices can be electrically isolated from each other according to design requirements.

FIGS. 3-10 show respective steps of a method for manufacturing a semiconductor device according to embodiments of the present disclosure. The following description will be given using Si-base materials as an example. However, it should be understood that the present disclosure is not limited to the Si-base materials, but can be applied to various other semiconductor materials.

Figure 3:
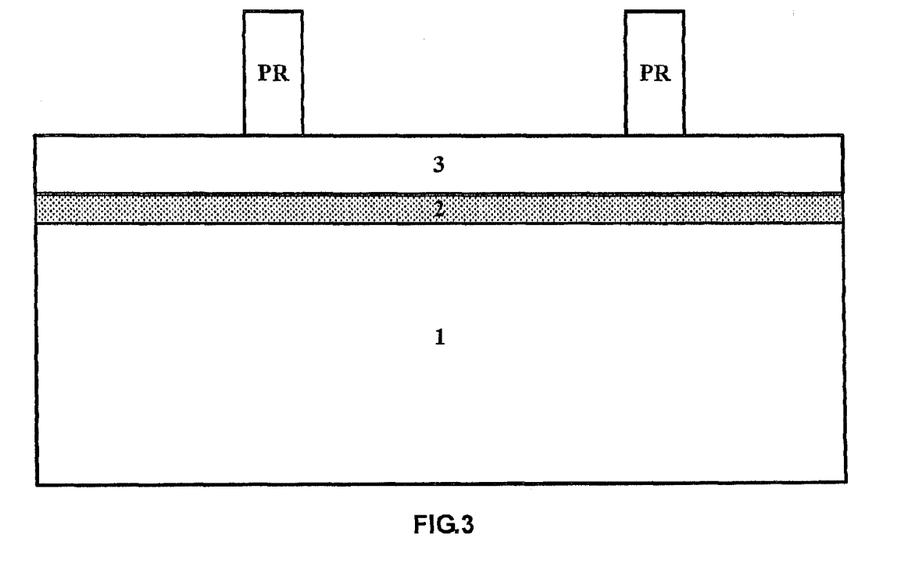
FIGS. 3-10 schematically show respective steps of a method for manufacturing a semiconductor device according to embodiments of the present disclosure.

As shown in FIG. 3, a semiconductor layer 1 is provided. The semiconductor layer 1 may be, e.g., a semiconductor substrate of a bulk semiconductor material, or a semiconductor layer on a substrate such as an SOI substrate. The semiconductor layer 1 may comprise a semiconductor material selected from a group consisting of, e.g., Si, Ge, SiGe, and III-V group compound semiconductor materials. An oxide (e.g., silicon dioxide) layer 2 and a nitride (e.g., silicon nitride) layer 3 are deposited in sequence on the semiconductor layer 1. For example, the oxide layer may have a thickness of about 2-5 nm. The nitride layer may have a thickness of about 10-50 nm. The oxide layer and the nitride layer are used as a hard mask layer 200 in later steps. Also, a patterned photoresist layer PR is formed on the nitride layer. The patterned photoresist layer PR is disposed in regions where fins are to be formed.

Figure 4:
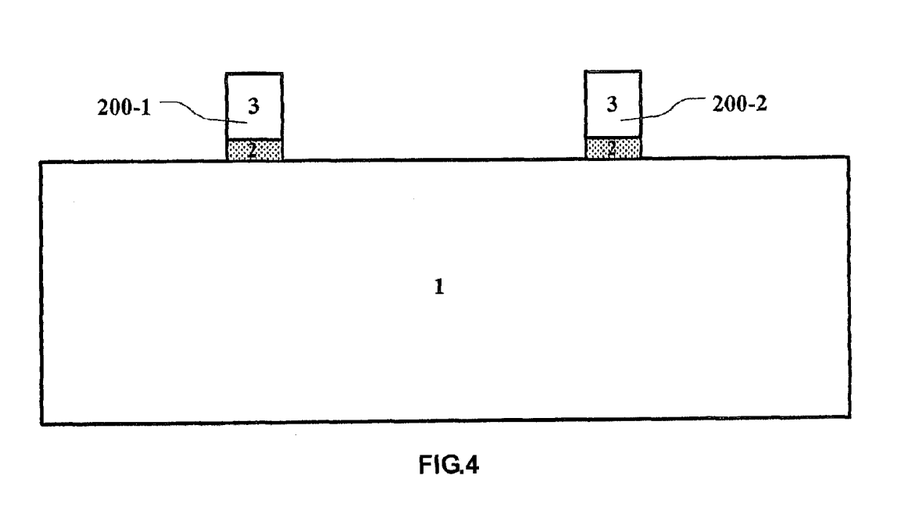

Next, as shown in FIG. 4, the hard mask layer 200 is patterned. In particular, the nitride layer 3 is etched by, e.g., Reactive Ion Etching (RIE), using the patterned photoresist layer PR as a mask. The etching stops at the oxide layer 2. Then, the oxide layer 2 is etched by, e.g., RIE, and the etching stops at the semiconductor layer 1. In this way, patterned hard mask layers 200-1 and 200-2 are formed. Then the photoresist layer PR is removed.

Figure 5:
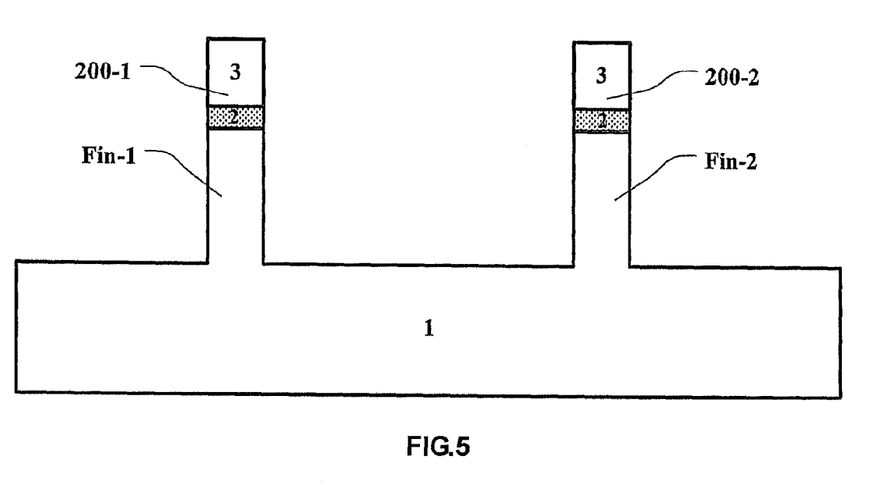

Next, as shown in FIG. 5, the semiconductor layer 1 is patterned by, e.g., RIE, using the patterned hard mask layers 200-1 and 200-2 as masks, so as to form a first fin Fin-1 and a part of a second fin Fin-2 in the semiconductor layer 1. The first fin Fin-1 and the part of the second fin Fin-2 have the same height. For example, etching depth can be controlled by controlling RIE process parameters such as ion energy and etching time, etc., according to device design requirements, and thereby the height of the fins can be controlled.

Figure 6:
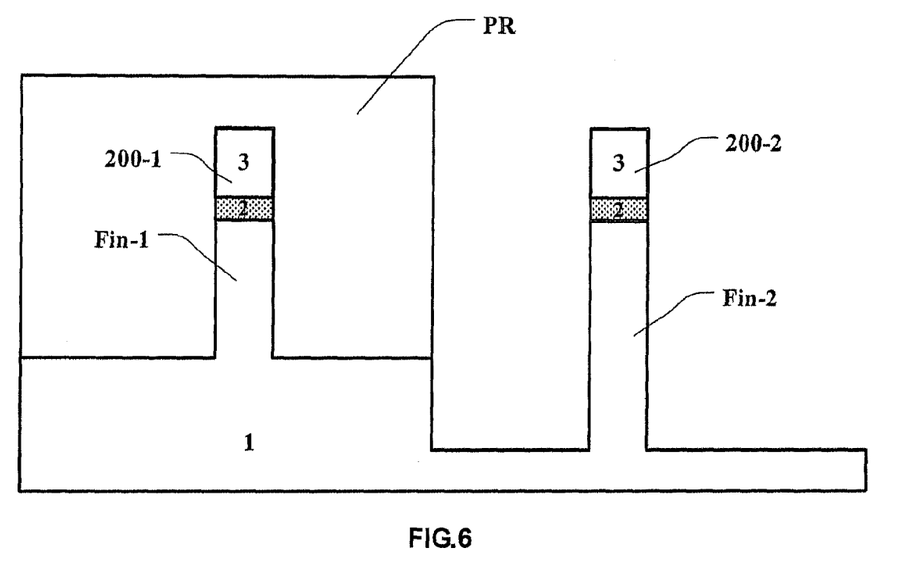

Then, as shown in FIG. 6, a left region (i.e., "a first region") is covered by a protection layer, such as a photoresist layer PR. A right region (i.e., "a second region") of the semiconductor layer 1 is further patterned by, e.g., RIE, to form a remaining part of the second fin Fin-2. After etching, the second fin Fin-2 becomes higher than the first fin Fin-1. Similarly, etching depth can be controlled by controlling RIE process parameters such as ion energy and etching time, etc., according to device design requirements, and thereby the height of the second fin can be controlled.

Figure 7:
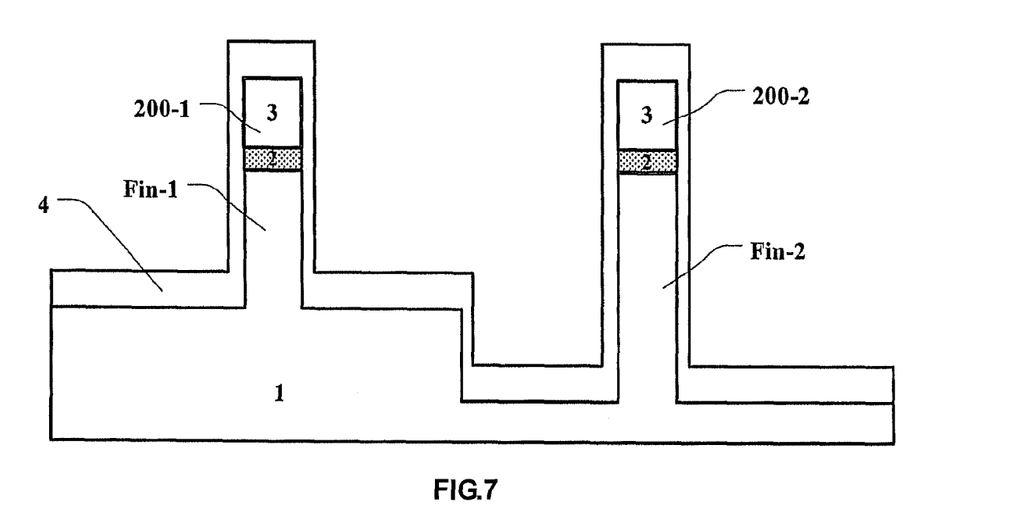

Finally, the protection layer PR is removed and a structure as shown in FIG. 7 is obtained. As shown in FIG. 7, the first fin Fin-1 is formed in the first region in the semiconductor layer 1, and has the hard mask layer 200-1 on its top. The second fin Fin-2 is formed in the second region in the semiconductor layer 1 and is higher than the first fin Fin-1. The second fin Fin-2 has the hard mask 200-2 on its top. It should be noted that the hard mask layers 200-1 and 200-2 can be removed in later processes.

According to the present disclosure, different regions of the semiconductor layer are selectively patterned by being etched to different depths, respectively. As a result, the fins with the different heights are formed in the same semiconductor layer.

Figure 8:
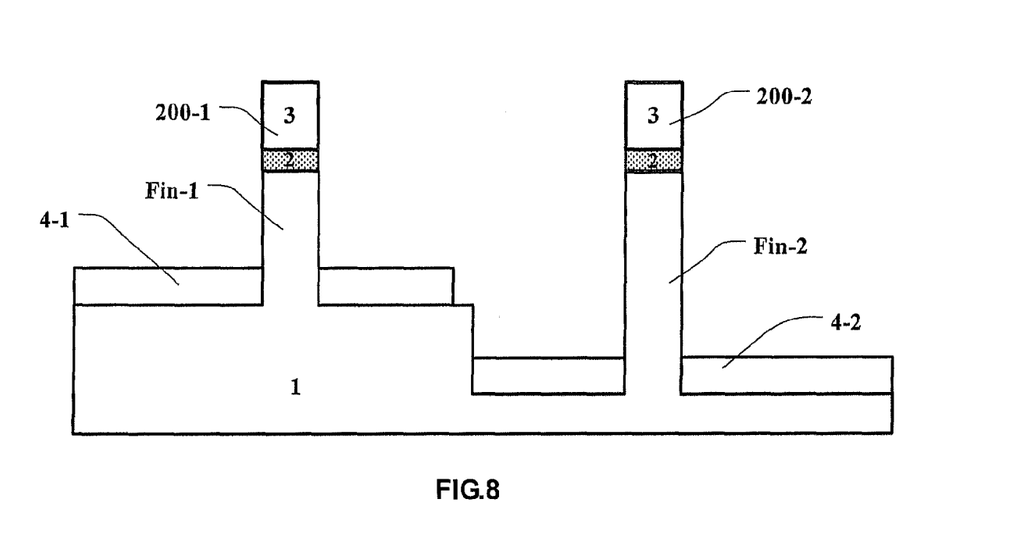

Next, as shown in FIGS. 7 and 8, an isolation layer is formed at both sides of each of the fins on the semiconductor layer. In particular, firstly, as shown in FIG. 7, an oxide layer 4 is deposited on the whole structure. The oxide layer 4 may comprise, e.g., High-Density Plasma (HDP) oxide (e.g., $SiO_2$). The oxide layer 4 is relatively thick at bottom, but is relatively thin on side faces of the fins. Then, as shown in FIG. 8, the oxide layer 4 is isotropically etched back to expose both side faces of each of the fins. In this way, an isolation layer 4-1 is formed at both sides of the first fin Fin-1, and an isolation layer 4-2 is formed at both sides of the second fin Fin-2.

Figure 9:
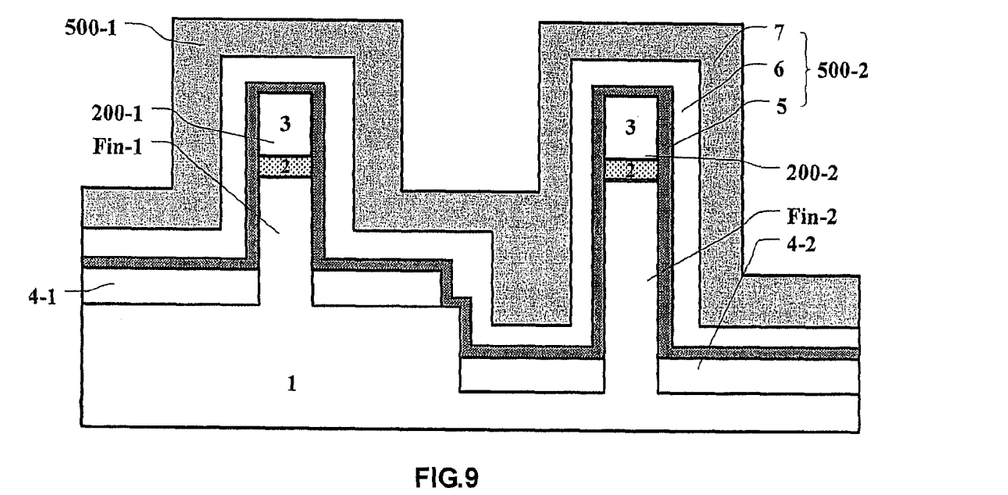

Then, as shown in FIGS. 9 and 10, gate stacks are formed. In particular, as shown in FIG. 9, a gate dielectric layer 5 and a gate electrode layer 7 are formed across each of the fins by, e.g., deposition. For example, the gate dielectric layer 5 may comprise a high-K gate dielectric material with a thickness of about 2-4 nm. For example, the high-K gate dielectric may be one material selected from a group consisting of $HfO_2$, HfSiO, HfSiON, HfTaO, HfTiO, HfZrO, $Al_2O_3$, $La_2O_3$, $ZrO_2$, and LaAlO, etc. The gate electrode layer 7 may comprise polysilicon or metal. For example, the metal may be one material selected from a group consisting of Ti, Co, Ni, Al, and W, etc. Optionally, a work-function adjusting layer 6 may be sandwiched between the gate dielectric layer 5 and the gate electrode layer 7. For example, the work-function adjusting layer may comprise one material selected from a group consisting of TiN, TiAlN, TaN, TaAlN, and TaC, etc.

Next, as shown in FIG. 10, gate stacks are formed by patterning. In particular, the gate electrode layer 7, the work-function adjusting layer 6 (and optionally the gate dielectric layer 5) are patterned by, e.g. RIE. In this way, the respective gate stacks are electrically insulated from each other and thus gate stacks 500-1 and 500-2 are obtained. In the embodiment shown in FIG. 10, the gate dielectric layer 5 is not patterned. However, the present disclosure is not limited thereto. Alternatively, the gate dielectric layer 5 can also be patterned.

Then source/drain regions and metal interconnections may be manufactured as in conventional processes to obtain the final device.

To this end, the semiconductor device according to the present disclosure is obtained. A perspective view of the semiconductor device is similar to that shown in FIG. 2, except that FIG. 2 does not show the specific structure of the gate stacks.

According to the embodiments of the present disclosure, the semiconductor layer is patterned such that in the first region, with respect to the fin, the remaining part of the semiconductor layer recesses to a certain depth (here referred to as "a first depth"), and in the second region, with respect to the fin, the remaining part of the semiconductor layer recesses to another certain depth (here referred to as "a second depth"). The fins with the different heights can be provided in the first region and the second region, respectively by making the first and second regions to recess to different depths, i.e., the first depth is different from the second depth. The heights of the fins correspond to the first depth and the second depth, respectively.

The embodiments of the present disclosure show two fins as an example. However, it is obvious that the present disclosure can be applied to cases of more fins. In such cases, the manufacturing method according to the present disclosure can be extended by adding further etching steps and adjusting etching depths accordingly. Details of the method in such cases will be omitted.

In the above description, technique details such as patterning and etching of respective layers are not specifically explained. However, one of ordinary skill in the art will understand that the layers and regions, etc. having desired shapes may be formed by various approaches in the prior art. Further, one of ordinary skill in the art may design a method not completely the same as above to form the same structure.

Although various embodiments have been described, it does not mean that advantageous features in these embodiments cannot be combined.

It should be understood that the foregoing embodiments of the present disclosure are only used for illustrating or explaining the principle of the present disclosure rather than limiting the scope thereof. Any modifications, substitutions, and improvements without departing from the spirit and scope of the present disclosure will fall within the scope of the present disclosure. The claims of the present disclosure intend to cover all variations and modifications that fall within the scope and border of the present disclosure or equivalents thereof.

What is claimed is:

1. A semiconductor device, comprising:
   a semiconductor layer;
   a first fin being formed by patterning the semiconductor layer and comprising a first top side and a first bottom side;
   a second fin being formed by patterning the semiconductor layer and comprising a second top side and a second bottom side,
   a first gate stack being formed across the first fin and comprising a first topmost side and a first bottommost side; and
   a second gate stack being formed across the second fin and comprising a second topmost side and a second bottommost side;
   wherein:
      the first top side and the second top side are at the same height, the first bottom side and the second bottom side are in direct contact with the semiconductor layer, and the second fin is taller than the first fin;
      the first and second gate stacks each comprise at least a gate dielectric layer and a gate electrode layer;
      a first isolation layer between the first gate stack and the semiconductor layer and a second isolation layer between the second gate stack and the semiconductor layer, the first and second isolation layers have a same thickness;
      a distance between the first topmost side and the first bottommost side is shorter than a distance between the second topmost side and the second bottommost side;
      the first fin and the second fin are immediately next to each other;
      the first bottom side and the second bottom side are at different heights;
      a first side surface of the first fin has a length, which is a distance from the first top side to the first bottom side, the length of the first side surface of the first fin is the same as a length of a second side surface of the first fin, wherein the second side surface of the first fin is opposite the first side surface of the first fin;
      a first side surface of the second fin has a length, which is a distance from the second top side to the second bottom side, the length of the first side surface of the second fin is the same as a length of a second side surface of the second fin, wherein the second side surface of the second fin is opposite the first side surface of the second fin; and
      only one step structure is formed by the semiconductor layer between the first fin and the second fin.

2. The semiconductor device according to claim 1, wherein each of the first and second stacks is isolated from the semiconductor layer by the first and second isolation layers, respectively.

3. The semiconductor device according to claim 1, further comprising:
   a first hard mask layer being formed between the first gate stack and the first top side; and
   a second hard mask layer being formed between the second gate stack and the second top side.

4. The semiconductor device according to claim 3, further comprising:
   a first oxide layer being formed between the first hard mask layer and the first top side; and
   a second oxide layer being formed between the second hard mask layer and the second top side.

* * * * *